United States Patent [19]

Ibuchi

[11] Patent Number: 4,952,968
[45] Date of Patent: Aug. 28, 1990

[54] APPARATUS FOR THE FORMATION OF IMAGES

[75] Inventor: Yoshiaki Ibuchi, Nara, Japan

[73] Assignee: Sharp Kabushiki Kaisha, Osaka, Japan

[21] Appl. No.: 412,815

[22] Filed: Sep. 26, 1989

[30] Foreign Application Priority Data

Sep. 26, 1988 [JP] Japan ................................ 63-240540
Sep. 30, 1988 [JP] Japan ................................ 63-129339

[51] Int. Cl.⁵ ...................... G03B 27/32; G03B 27/52
[52] U.S. Cl. ........................................ 355/27; 430/138
[58] Field of Search .................. 355/27, 77, 308, 205, 355/207; 354/297–304; 430/138

[56] References Cited

U.S. PATENT DOCUMENTS 4,624,560 11/1986 Beery ..................................... 355/27
4,770,972 9/1988 Nelson et al. ........................ 430/138

Primary Examiner—Richard A. Wintercorn
Attorney, Agent, or Firm—Irell & Manella

[57] ABSTRACT

An apparatus for the formation of images, in which a photosensitive sheet coated with pressure-rupturable capsules that are hardened by light is first transported through a light-exposure section to be illuminated by an illuminating means to obtain a latent image, and then temporarily stored in a buffer section, and transported through a pressure-transfer section consisting of a pair of pressure rollers to be pressed against an image-receiving sheet to obtain a colored image on the image-receiving sheet, and is finally wound around a take up rod, the illuminating means selectively illuminating the photosensitive sheet so as to harden some of the pressure-rupturable capsules thereon to form the latent image, and the apparatus comprising: a secondary illuminating means for entirely illuminating a predetermined portion of the photo-sensitive sheet so as to harden all the pressure-rupturable capsules thereon when said portion of the photosensitive sheet is being transported alone through the pressure-transfer section without the image-receiving sheet after the jamming of the image-receiving sheet occurs and the jammed sheet is removed from the body of the apparatus.

3 Claims, 7 Drawing Sheets

APPARATUS FOR THE FORMATION OF IMAGES

BACKGROUND OF THE INVENTION

1. Field of the invention:

This invention relates to an apparatus for the formation of images in which a photosensitive sheet coated with pressure-rupturable capsules is first transported through a light-exposure section to be exposed to light to obtain a latent image and then temporarily stored in a buffer section, and finally transported together with an image-receiving sheet through a pressure-transfer section to be pressurized to obtain a colored image on said image-receiving sheet, and more particularly relates to an apparatus for the formation of images in which pressure-rupturable capsules on said photosensitive sheet are prevented from rupturing when the photosensitive sheet is transported alone without said image-receiving sheet through said pressure-transfer section.

2. Description of the prior art:

An apparatus for the formation of images in which a photosensitive sheet coated with pressure-rupturable capsules containing chromogenic materials is first exposed to light to obtain a latent image and then is pressed against an image-receiving sheet coated with developing materials to obtain a colored image on the image-receiving sheet has been proposed by, for example, Japanese Laid-Open Patent Publication No. 58-88739.

The image-forming process in such an apparatus comprises two steps; a light-exposure step and a pressure-transfer step. In the light-exposure step, the photosensitive sheet, one side of which is coated with pressure-rupturable capsules containing chromogenic materials that are hardened when exposed to light, is first transported into a light-exposure section, where it is exposed to light reflected from an original. The light reflected from the original selectively illuminates the pressure-rupturable capsules on the photosensitive sheet so that some of the capsules receive the light and become hardened and the others do not receive the light and are left unchanged, resulting in a latent image corresponding to the image of the original. Then, in the pressure-transfer step, the photosensitive sheet on which the latent image has been formed is transported into the pressure-transfer section, where the photosensitive sheet is placed together with the image-receiving sheet and pressure is applied thereto. Thus, the pressure-rupturable capsules that have not been hardened rupture, allowing the chromogenic materials contained therein to flow out onto the image-receiving sheet. Then, the chromogenic materials react with the developing materials coated on the image-receiving sheet, which gives rise to color in the chromogenic materials, resulting in a colored image corresponding to the latent image on the image-receiving sheet. In general, the pressure-transfer section consists of a pair of pressure rollers, between which the photosensitive sheet and the image-receiving sheet are supplied at the same time to be pressurized.

In the light-exposure step mentioned above, the speed at which the photosensitive sheet is transported through the light-exposure section determines the light-exposure time, which in turn determines the degree to which the capsules are hardened. This influences the quality of a latent image to be formed on the photosensitive sheet. Similarly, in the pressure-transfer step mentioned above, the speed at which the photosensitive sheet is transported through the pressure-transfer section determines the time of the reaction between the chromogenic materials and the developing materials. The reaction time influences the quality of a colored image to be formed on the image-receiving sheet. In order to obtain a distinct colored image, the photosensitive sheet should be transported through the light-exposure section at the optimum speed (hereinafter referred to as "the optimum light-exposure speed") so that a latent image can be properly formed with the optimum light-exposure time, and then should be transported through the pressure-transfer section at the optimum speed (hereinafter referred to as "the optimum pressure-transfer speed") so that a colored image can be properly formed with the optimum reaction time. In general, the optimum light-exposure speed is different from the optimum pressure-transfer speed. If the photosensitive sheet is continuously transported through the light-exposure section and the pressure-transfer section, it can only be transported at the same speed through those two sections. Thus, the sheet-transporting speed cannot be set at the respective optimum level for each section, and a distinct colored image cannot be obtained.

To solve the above-mentioned problem, an apparatus for the formation of images has been proposed by, for example, Japanese Patent Application No. 63-64426 in which the photosensitive sheet is first transported from the roll of the sheet through the light-exposure section to a buffer section at the optimum light-exposure speed and temporarily stays at the buffer section between the light-exposure section and the pressure-transfer section, and is finally transported from the buffer section into the pressure-transfer section at the optimum pressure-transfer speed.

In such an apparatus, the sheet-transportation speed can be set at respective optimum levels for the light-exposure section and the pressure-transfer section, as mentioned above. This makes it possible to properly form a latent image on the photosensitive sheet and a distinct colored image on the image-receiving sheet.

The buffer section mentioned above generally comprises a buffer roller which usually stays at its base position between the light-exposure section and the pressure transfer section. The buffer roller moves from the base position into a position away from the pressure-transfer section at the time of the light-exposure step, and comes back to the base position at the time of the pressure-transfer step. With this movement of the buffer roller, the photosensitive sheet is transported through the light-exposure section at the optimum light-exposure speed and then transported through the pressure-transfer section at the optimum pressure-transfer speed.

Such an apparatus, however, is sometimes jammed by an image-receiving sheet at the time of the pressure-transfer step. When the jamming occurs, the operation of the apparatus is suspended with its main motor stopped so that the jammed sheet is removed from the body of the apparatus. Since the light-exposure step has been completed, the portion of the photosensitive sheet corresponding to the latent image is located at the buffer section. Thus, after the image-receiving sheet is removed, this portion of the photosensitive sheet should be transported from the buffer section through the pressure-transfer section to be wound around a take up rod so that the whole apparatus is ready for the next image-forming process. When the portion of the photosensitive sheet corresponding to the latent image is transported through the pressure-transfer section to be pressurized alone without the image-receiving sheet, the pressure-rupturable capsules that are not hardened are pressurized to rupture, allowing the chromogenic materials therein to flow out onto the pressure rollers and/or other components within the body of the apparatus. This causes the pressure rollers and/or the inside of the body of the apparatus to be stained with the chromogenic materials. Moreover, when another image-receiving sheet is transported into the pressure rollers at the time of the next image-forming process, the chromogenic materials that have flown onto the pressure rollers may adhere to the back of the sheet.

SUMMARY OF THE INVENTION

The apparatus for the formation of images of this invention, which overcomes the above-discussed and numerous other disadvantages and deficiencies of the prior art, is an apparatus for the formation of images, in which a photosensitive sheet coated with pressure-rupturable capsules that are hardened by light is first transported through a light-exposure section to be illuminated by an illuminating means to obtain a latent image, and then temporarily stored in a buffer section, and transported through a pressure-transfer section consisting of a pair of pressure rollers to be pressed against an image-receiving sheet to obtain a colored image on said image-receiving sheet, and is finally wound around a take up rod, said illuminating means selectively illuminating said photosensitive sheet so as to harden some of the pressure-rupturable capsules thereon to form said latent image, and said apparatus comprising: a secondary illuminating means for entirely illuminating a predetermined portion of said photosensitive sheet so as to harden all the pressure-rupturable capsules thereon when said portion of said photosensitive sheet is being transported alone through said pressure-transfer section without said image-receiving sheet after the jamming by said image-receiving sheet occurs and the jammed sheet is removed from the body of the apparatus.

In a preferred embodiment, a pressure-release means that moves said pressure rollers of said pressure-transfer section away from each other so as to allow said predetermined portion of said photosensitive sheet to be transported therebetween without being pressurized.

In a preferred embodiment, the predetermined portion of said photosensitive sheet illuminated by said secondary illuminating means includes at least the portion of said photosensitive sheet corresponding to said latent image that has been formed thereon before said jamming occurs.

Thus, the invention described herein makes possible the objective of providing an apparatus for the formation of images in which, when a photosensitive sheet is transported alone through a pressure-transfer section after the jamming of an image-receiving sheet occurs and the jammed sheet is removed, pressure-rupturable capsules on the photosensitive sheet do not rupture in the pressure-transfer section, so that the chromogenic materials therein do not flow out, preventing the pressure rollers and/or the inside of the body of the apparatus from being stained with the chromogenic materials, and also preventing an image-receiving sheet which will be transported into the pressure transfer section in the next image-forming process from being stained with the chromogenic materials.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 2:
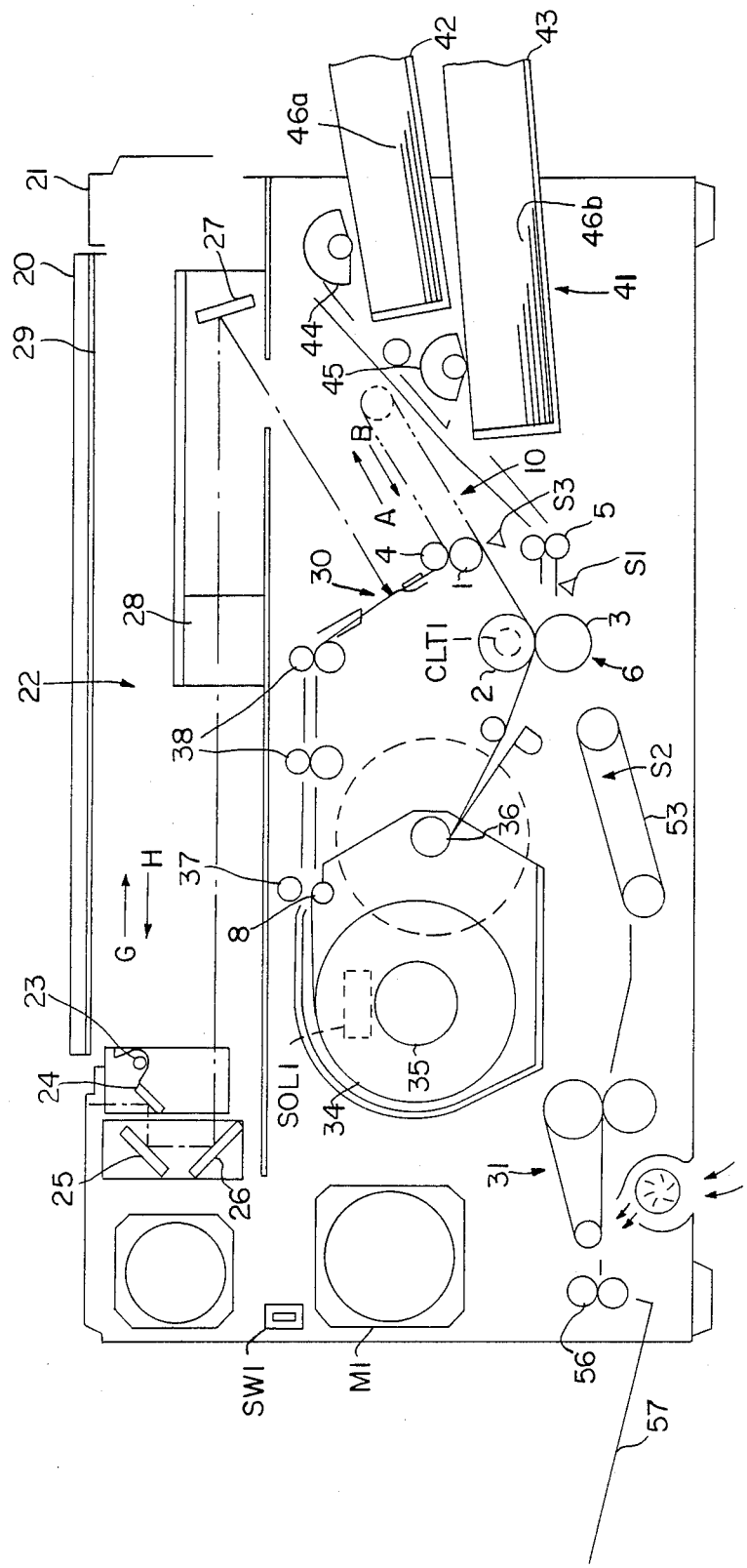
FIG. 2 is a front sectional view showing the apparatus for the formation of images of the invention.

FIG. 2 shows an apparatus for the formation of images of the invention, which comprises a body 21, in the substantial center of which a photosensitive sheet 34 wound around a sheet-feeding rod 35 into a roll is disposed. The photosensitive sheet 34 is drawn out from the sheet-feeding rod 35, directed through rollers 37 and 38 into a light-exposure section 30, and transported along a roller 4 and a buffer roller 1 into a pressure-transfer section 6 which consists of pressure rollers 2 and 3, and then wound around a take up rod 36. One side of the photosensitive sheet 34 is coated with pressure-rupturable capsules containing chromogenic materials that are hardened when exposed to light.

Paper cassettes 42 and 43, which contain image-receiving sheets of predetermined sizes 46a and 46b, respectively, are attached to one side of the body 21. The paper cassettes 42 and 43 are provided with paper supply rollers 44 and 45, respectively, all constituting a paper supply section 41. The image-receiving sheet is coated with developing materials which react with the above-mentioned chromogenic materials to give rise to color images.

Before a pressure-transfer step described below starts, the paper supply roller 44 or 45 is selected to be driven, so that the respective image-receiving sheet 46a or 46b is transported into a pair of resist rollers 5. At the time of the pressure-transfer step, the resist rollers 5 rotate to convey the image-receiving sheet 46a or 46b into the pressure-transfer section 6, where the front end of the image-receiving sheet 46a or 46b is precisely disposed on the front end of an image-forming area on the photosensitive sheet 34.

On the top surface of the body 21 is provided a plate 29 made of hard transparent glass, on which an original to be copied is placed. The upper surface of the plate 29 can be covered with a cover 20. An optical system 22 including a light-emitting device 23, mirrors 24, 25, 26, and 27, and a lens 28 is disposed below the plate 29. The light-emitting device 23 and the mirrors 24, 25, and 26 of the optical system 22 move under the plate 29 in the direction of arrow G and H so as to scan the image of the original placed on the plate 29. At a light-exposure step, the light emitted from the light-emitting device 23 is reflected from the original, and then directed to the light-exposure section 30 via the mirrors 24, 25, 26, 27, and the lens 28 as shown by a dash-dot line in FIG. 2, thereby selectively illuminating an image-forming area of the photosensitive sheet 34. Accordingly, some of the pressure-rupturable capsules on the image-forming area receive the light and become hardened, while others do not receive the light and remain unchanged, resulting in a latent image corresponding to the image of an original. During the period of this light-exposure step, the buffer roller 1 moves in the direction of arrow A at a speed which is half as high as the optimum light-exposure speed V1. Thus, the photosensitive sheet 34 passes through the light-exposure section 30 at the optimum light-exposure speed V1 so that the latent image can be properly formed.

Thereafter, in the pressure-transfer step, the pressure rollers 2 and 3 rotate to move the buffer roller 1 in the direction of arrow B, so that the photosensitive sheet 34 on which the latent image has been formed is transported into the pressure-transfer section 6, where at the same time the image-receiving sheet 46a or 46b is also supplied as described above. The two sheets are pressed against each other so that the pressure-rupturable capsules on the photosensitive sheet 34 that have not been hardened rupture to allow the chromogenic materials therein to flow out onto the image-receiving sheet 46a or 46b. The chromogenic materials react with the developing materials coated on the image-receiving sheet 46a or 46b, thereby a colored image corresponding to the latent image being formed on the image-receiving sheet 46a or 46b. During this pressure-transfer step, the pressure rollers 2 and 3 rotate to move the buffer roller 1 in the direction of arrow B in such a manner that the photosensitive sheet 34 is transported at the optimum pressure-transfer speed V2. Thus, a distinct colored image can be obtained.

After the formation of the colored image, the image-receiving sheet 46a or 46b is transported by a conveyer 53 into a glossing device 31, where the colored image on the image-receiving sheet 46a or 46b is made glossy. The image-receiving sheet 46a or 46b is then transported by a pair of paper discharge rollers 56 out of the body 21 onto a paper receiving tray 57.

In order to detect the interference in the smooth transportation of the image-receiving sheet 46a or 46b, sensors S1 and S2 are provided. The sensor S1, which is disposed between the pressure-transfer section 6 and the resist rollers 5, is ON for a predetermined period while the image-receiving sheet 46a or 46b is being conveyed from the resist rollers 5 to the pressure-transfer section 6. The sensor S2, which is disposed at the conveyer 53, is ON for a predetermined period while the image-receiving sheet 46a or 46b is being transported by the conveyer 53.

Figure 1:
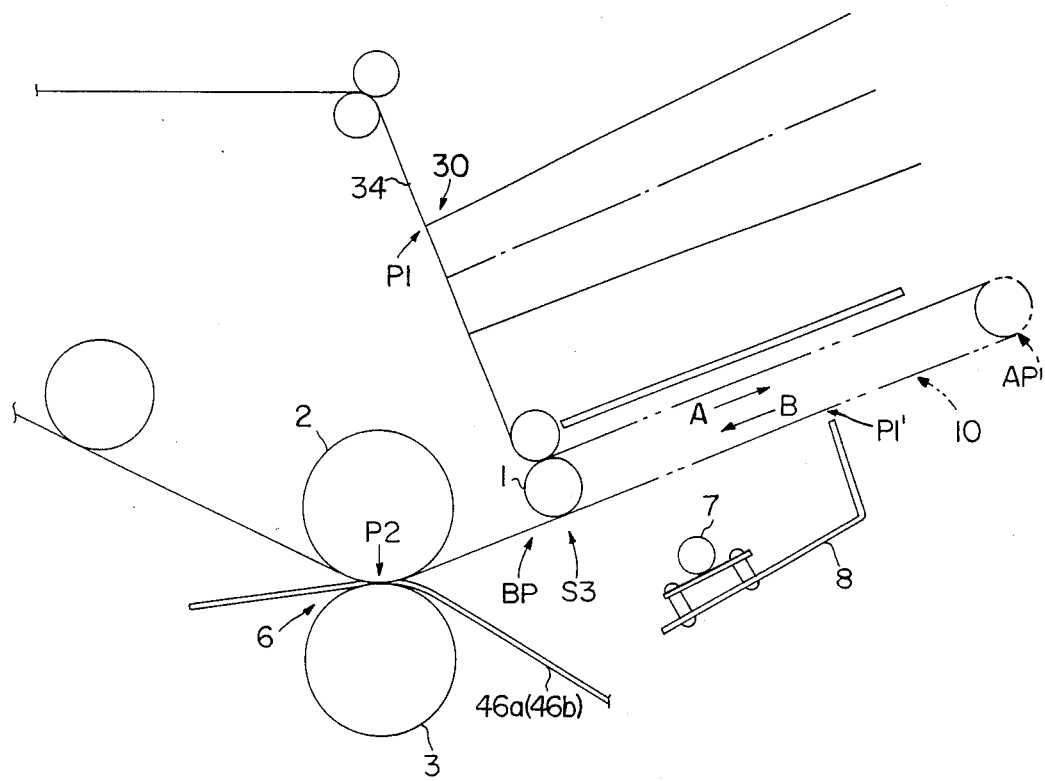
FIG. 1 is a schematic diagram showing the sheet-transporting operation of an apparatus for the formation of images of the invention.

FIG. 1 shows the sheet-transporting operation of the apparatus of the invention.

The buffer roller 1, which is disposed between the light-emitting section 30 and the pressure-transfer section 6, can be moved in the direction of arrows A and B as mentioned above. During the period of the light-exposure step, the buffer roller 1 is moved from its base position BP shown by a solid line in the direction of arrow A into an auxiliary position AP shown by a line of dashes and double dots. During the period of the pressure-transfer step, the buffer roller 1 is moved from the auxiliary position AP in the direction of arrow B into the base position BP.

A sensor S3 is provided at the base position BP to detect the presence of the buffer roller 1. The sensor S3 is ON when the buffer roller 1 is at the base position BP and it is OFF when the buffer roller 1 is not at the base position BP.

At the beginning of the light-exposure step, the buffer roller 1 is at its base position BP, and the front end of an image-forming area of the photosensitive sheet 34 is located at an exposure-starting position P1. When the light-exposure step starts, the buffer roller 1 is moved in the direction of arrow A so that the image-forming area of the photosensitive sheet 34 moves from the exposure-starting position P1 and passes through the light-exposure section 30, resulting in a latent image. When the buffer roller 1 reaches the position AP, the portion of the photosensitive sheet 34 including the image-forming area on which the latent image has been formed stays at a buffer section 10 in the form of a loop as shown by a line of dashes and double dots in FIG. 1. The front end of the image forming area (the latent image) is located at an exposure-ending position P1'. The back end of the previous latent image is located at the pressurizing position P2 of the pressure-transfer section 6. Thus, a non-image area on which no latent image is formed is located between the pressurizing position P2 and the exposure-ending position P1'.

Below the lower side of the loop of the photosensitive sheet 34 is provided a lamp 7 and a light-blocking plate 8. The light-blocking plate 8 is so arranged that the light from the lamp 7 is directed onto the non-image area between the pressurizing position P2 and the exposure-ending position P1'.

When the buffer roller 1 begins to move in the direction of arrow A in the light-exposure step, the lamp 7 is turned on so as to illuminate the non-image area. As a result, at the end of the light-exposure step, the pressure-rupturable capsules on the non-image area of the photosensitive sheet 34 are hardened. Thus, when the photosensitive sheet 34 corresponding to the non-image area is transported through the pressure rollers 2 and 3 in the pressure-transfer step, the pressure-rupturable capsules thereon will not rupture to allow the chromogenic materials therein to flow out.

When the apparatus of the invention is jammed by an image-receiving sheet, which may occur at the time of the pressure-transfer step, the operation of the apparatus is suspended and a front cover (not shown) of the body 21 is opened so that the jammed sheet can be removed from the body 21. After the removal of the jammed sheet, the front cover is closed and the apparatus is reset so that it is ready for the next image-forming process; that is, the portion of the photosensitive sheet 34 corresponding to the latent image, which has been formed in the light-exposure step and still remains at the buffer section 10, is transported from the buffer section 10 through the pressure-transfer section 6 to be wound around the take up rod 36 (This operation of the apparatus is hereinafter referred to as "resetting operation"). This resetting operation allows the new portion of the photosensitive sheet 34 to be subjected to the next image-forming process.

In the resetting operation of the apparatus, the portion of the photosensitive sheet 34 corresponding to the latent image passes between the pressure rollers 2 and 3 without being placed together with the image-receiving sheet 46a or 46b. Since some of the pressure-rupturable capsules on the photosensitive sheet 34 corresponding to the latent image are not hardened as described above, the unhardened capsules will be pressurized to rupture if they remain unhardened when transported between the pressure rollers 2 and 3. This causes the chromogenic materials contained in the capsules to flow out onto the pressure rollers 2 and 3 and/or the inside of the body 21.

In the resetting operation of the apparatus for the formation of images of the invention, therefore, the above-mentioned unhardened capsules are exposed to light to be hardened before being transported into the pressure-transfer section 6, as will now be described.

Figure 3:
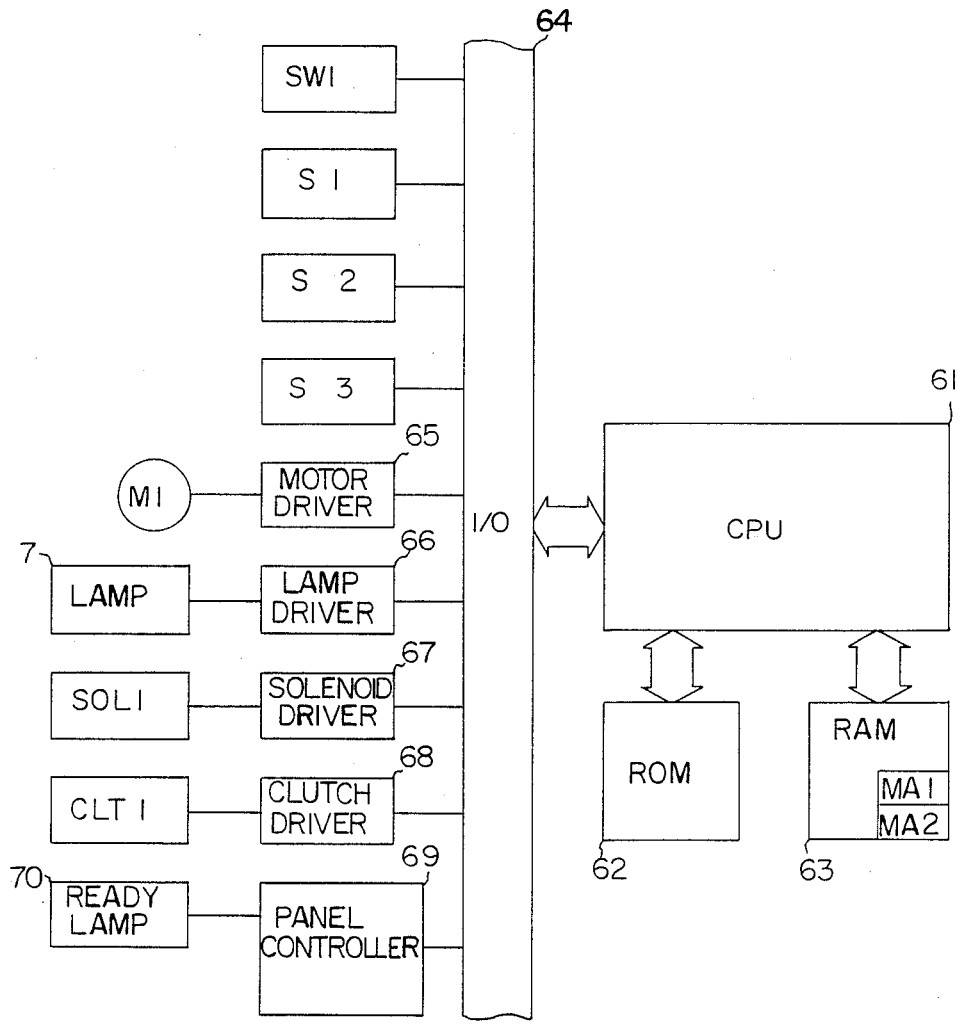
FIG. 3 is a block diagram showing a control system of the apparatus of the invention.

FIG. 3 shows a control system for the resetting operation of the apparatus of the invention.

An I/O interface 64 connects a CPU 61 to a cover switch SW1, the sensors S1, S2, and S3, a motor driver 65, a lamp driver 66, a solenoid driver 67, a clutch driver 68, and a panel controller 69. The cover switch SW1 is ON when the above-mentioned front cover of the apparatus is opened to allow the jammed image-receiving sheet to be manually removed from the body 21, and it is OFF when the front cover is placed back to the body 21. The motor driver 65, the lamp driver 66, the solenoid driver 67, and the clutch driver 68 are connected to a main motor Ml, the lamp 7, a solenoid SOL1, and a clutch CLT1, respectively. The main motor M1 drives the rollers for transporting the photosensitive sheet 34 and the image-receiving sheet 46a or 46b. By the use of the solenoid SOL1, the sheet-feeding rod 35 is locked when the feeding of the photosensitive sheet 34 is not required. When the solenoid SOL1 is energized, the sheet-feeding rod 35 is locked to prevent the photosensitive sheet 34 from being drawn out, and when it is de-energized, the sheet-feeding rod 35 is unlocked to allow the photo-sensitive sheet 34 to be drawn out. The clutch CLT1 conveys the rotational power generated by the main motor M1 to the pressure rollers 2 and 3. The panel controller 69 is connected to devices arranged on an operation panel such as a ready lamp 70, displays, switches, and the like.

The CPU 61 outputs signals to the drivers 65, 66, 67 and 68, and the panel controller 69 in accordance with the program that has been previously stored in a ROM 62. In accordance with these signals, the drivers 65, 66, 67, and 68, and the panel controller 69 respectively operate the main motor M1, the lamp 7, the solenoid SOL1, the clutch CLT1, and the devices arranged on the operation panel such as the ready lamp 70. Timers T1 and T2 described below are respectively allocated to memory areas MA1 and MA2 of a RAM 63 connected to the CPU 61.

Figure 4:
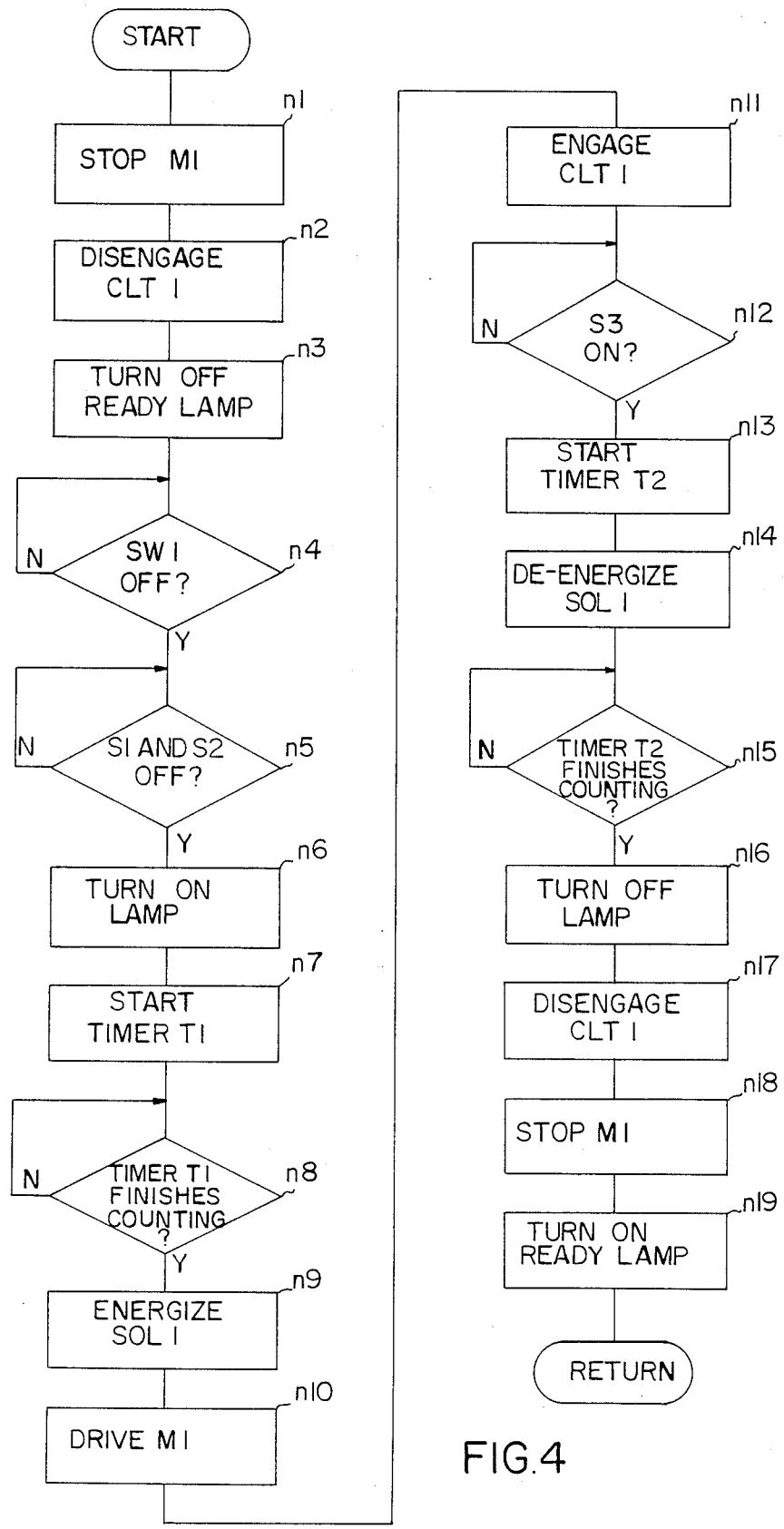
FIG. 4 is a flow-chart showing the operation of the control system of the apparatus of the invention.

FIG. 4 is a flow-chart showing the procedure of the resetting operation of the apparatus for the formation of images.

When the apparatus is jammed by the image-receiving sheet 46a or 46b in the pressure-transfer step, the sensors S1 and/or S2 are on for a longer time than a predetermined period. As a result, the CPU 61, which decides that jamming has occurred, outputs signals to the motor driver 65 so as to suspend the operation of the main motor M1 in step n1, and at the same time outputs signals to the clutch driver 68 so as to disengage the clutch CLT1 in step n2 and also outputs signals to the panel controller 69 so as to turn off the ready lamp 70 in step n3. When the ready lamp 70 is turned off, the front cover of the body 21 is opened by the user so that the jammed image-receiving sheet 46a or 46b is manually removed from the body 21. After the removal of the jammed sheet, the front cover is closed, so that the cover switch SW1 is OFF in step n4 and the sensors S1 and S2 are OFF in step n5, from which the CPU 61 decides that the jammed image-receiving sheet 46a or 46b is removed. Accordingly, the lamp 7 is turned on to illuminate the the portion of the photosensitive sheet 34 on the lower side of the buffer section 10 in step n6. At the same time, the timer T1 which is allocated to the memory area MA1 of the RAM 63 is started in step n7. The timer T1 counts the time required for the lamp 7 to illuminate the above-mentioned portion of the photosensitive sheet 34. When the timer finishes counting in step n8, the solenoid SOL1 is energized to suspend the rotation of the sheet-feeding rod 35 in step n9 so that the photosensitive sheet 35 is not drawn out any more from the sheet-feeding rod 35. At the same time, the main motor M1 is driven and the clutch CLT1 is engaged in steps n10 and n11. As a result, the pressure rollers 2 and 3 rotate and the buffer roller 1 moves in the direction of arrow B, so that the portion of the photosensitive sheet 34 that has been on the upper side of the buffer section 10 is transported into the pressure-transfer section 6. While the photosensitive sheet 34 is being transported from the buffer section 10 into the pressure-transfer section 6, the photosensitive sheet 34 is illuminated by the lamp 7.

When the buffer roller 1 reaches the base position BP, the sensor S3 is ON in step n12, so that the timer T2 allocated to the memory area MA2 of the RAM 63 is started in step n13 and that the solenoid SOL1 is de-energized to unlock the sheet-feeding rod 35 in step n14, allowing another length of the photosensitive sheet 34 to be drawn out. The timer T2 counts the time required for the photosensitive sheet 34 to be drawn out by the same length as that of the light-exposure section 30. This further feeding of the photosensitive sheet 34 ensures that the new portion of the photosensitive sheet 34 will be ready for the next light-exposure step. When the timer T2 finishes counting in step n15, the lamp 7 is turned off in step n16, the clutch CLT1 is disengaged and the operation of the main motor M1 is suspended in steps n17 and n18. As a result, the rotation of the pressure rollers 2 and 3 is suspended, so that the transportation of the photosensitive sheet 34 stops. Thereafter, the ready lamp 70 is turned on in step n19, and the apparatus is ready for the next image-forming process. In this way, from the step n9 through the step n18, the photosensitive sheet 34 is transported alone into the pressure-transfer section 6 without the image-receiving sheet 46a or 46b and then wound around the take up rod 36.

In the apparatus for the formation of images, as described above, after the jammed image-receiving sheet is removed, the portion of the photosensitive sheet 34 on the lower side of the buffer section 10 is first illuminated by the lamp 7, and then the portion of the photosensitive sheet 34 on the upper side of the buffer section 10 is transported into the pressure-transfer section 6 by the rotation of the pressure rollers 2 and 3 while being illuminated by the lamp 7. In this way, the latent image that was formed in the light-exposure step and remained in the buffer section 10 is transported into the pressure-transfer section 6 while being illuminated by the lamp 7. Since the pressure-rupturable capsules of the latent image that have not been hardened are hardened by being exposed to the light, they will not rupture when being transported through the pressure-transfer section 6. Accordingly, the chromogenic materials in the capsules will not flow out, preventing the pressure rollers 2 and 3 and/or the inside of the body of the apparatus from being stained with the chromogenic materials. Moreover, an image-receiving sheet that will be transported through the pressure-transfer section 6 in the next image-forming process will not be stained with the chromogenic materials.

In the apparatus for the formation of images of this invention, as described above, the lamp 7, which is originally arranged to illuminate the non-image area at the time of the image-forming process, is also used as a lamp that illuminates the latent image in the above-mentioned resetting operation. This prevents increased cost of the production of the apparatus.

In the resetting operation of the apparatus of this invention, as described above, after the portion of the photosensitive sheet 34 corresponding to the latent image is exposed to light and transported through the pressure-transfer section 6, the photosensitive sheet 34 is further drawn out by the same length as that of the light-exposure section 30. This ensures that the new portion of the photosensitive sheet 34 becomes the next image-forming area, the front end of which is at the exposure-starting position for the proper formation of the next latent image.

EXAMPLE 2

Figure 5:
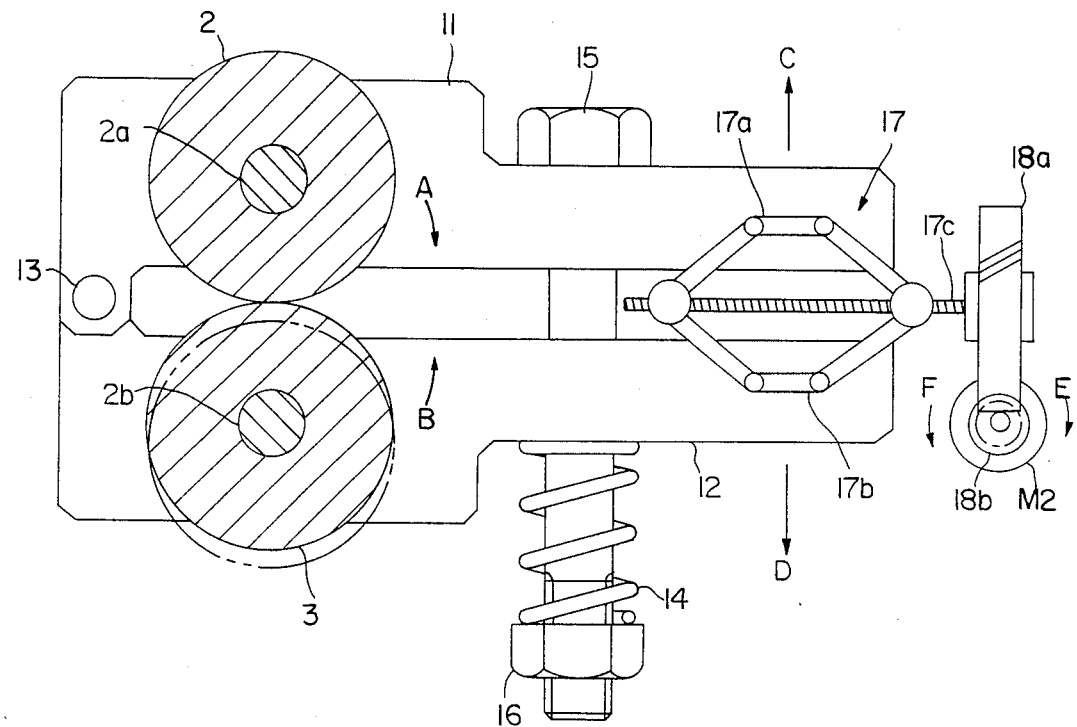
FIG. 5 is an enlarged view of a pressure-release system of another apparatus for the formation of images of the invention.

FIG. 5 shows a pressure-release system that is used in another apparatus for the formation of images of the invention. The structure of the apparatus of this example is the same as that of the apparatus of Example 1 except that the pressure rollers 2 and 3 are provided with this pressure-release system, which will now be described.

The pressure rollers 2 and 3 are rotatably connected to an upper guide 11 and a lower guide 12 via shafts 2a and 2b, respectively. The upper guide 11 and the lower guide 12 are connected to each other at a fulcrum 13 located at one end of the guides in such a manner that they can be rotated away from each other. At the other end of the upper and lower guides 11 and 12 is provided a lift 17 including parallel links 17a and 17b. A bolt 15, which passes through the upper guide 11 and then through the lower guide 12, is provided between the lift 17 and the pressure rollers 2 and 3. A spring 14 is wound around the portion of the bolt 15 that is extending downward from the lower guide 12. The bolt 15 is threaded into a nut 16 at the lower end of the spring 14. The parallel links 17a and 17b are fixed to the upper and the lower guides 11 and 12, respectively. A screw 17c is fixed to the parallel links 17a and 17b in such a way that the distance between the parallel links 17a and 17b, and thus between the upper and lower guides 11 and 12 can be changed by the rotation of the screw 17c. At the other end of the screw 17c is mounted a worm gear 18a, with which a worm roller 18b is engaged. The worm roller 18b is fixed to the shaft of a pressure-release motor M2. Thus, the rotational power generated by the pressure-release motor M2 is transmitted to the screw 17c via the worm roller 18b and the worm gear 18a.

In the pressure-release system arranged as described above, the upper guide 11 and the lower guide 12 are usually urged toward each other in the directions of arrows A and B by the resilience of the spring 14 while being supported at the fulcrum 13, and accordingly the pressure rollers 2 and 3 are pressed against each other so as to apply pressure to the photosensitive sheet and the image-receiving sheet transported therebetween in the image-forming process. When the pressure-release motor M2 is rotated in its regular direction shown by arrow E, the parallel links 17a and 17b of the lift 17 are moved in the direction of arrow C and D, respectively, so that the distance therebetween becomes larger. Thus, the upper guide 11 and the lower guide 12 are moved away from each other against the resilience of the spring 14. Accordingly, the pressure rollers 2 and 3 are slightly moved away from each other. In this case, the unhardened pressure-rupturable capsules on the photosensitive sheet will not be pressurized to rupture when being transported through the pressure rollers 2 and 3. When the pressure-release motor M2 is rotated in the opposite direction shown by arrow F, the parallel links 17a and 17b are moved back toward each other into their original positions. As a result, the pressure rollers 2 and 3 come into their original positions so that the unhardened pressure-rupturable capsules on the photosensitive sheet passing therebetween can be pressurized to rupture.

When the apparatus of this example is jammed by the image-receiving sheet in the pressure-transfer step and the jammed sheet is removed from the body of the apparatus, the portion of the photosensitive sheet 34 remaining in the buffer section 10 is transported through the pressure-transfer section 6 without being pressurized. This operation will be described below with reference to FIGS. 6 and 7.

Figure 6:
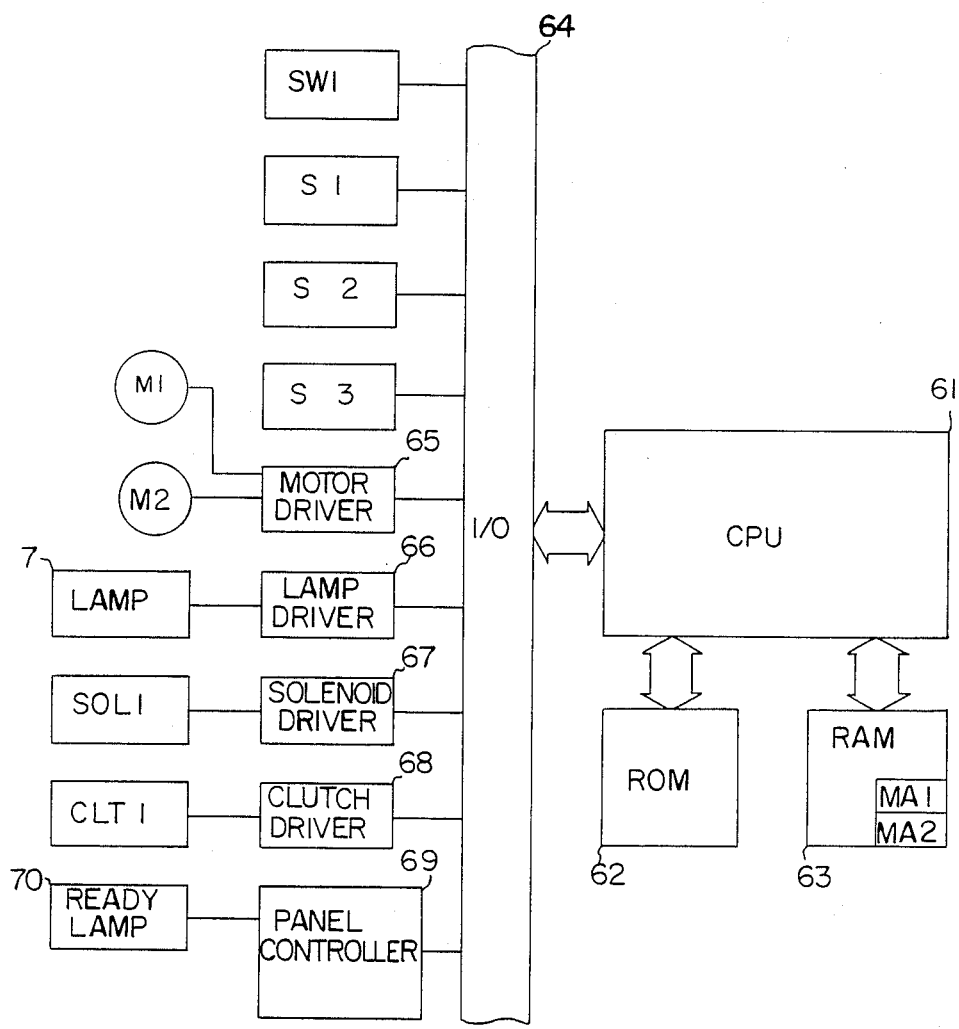
FIG. 6 is a block diagram showing the control system of the apparatus of the invention that comprises the pressure-release system of FIG. 5.

FIG. 6 is a block diagram showing the control system for the above-mentioned operation. The structure of the control system of this example is the same as that of the control system of Example 1, except that there is a pressure-release motor M2 connected to the motor driver 65.

Figure 7:
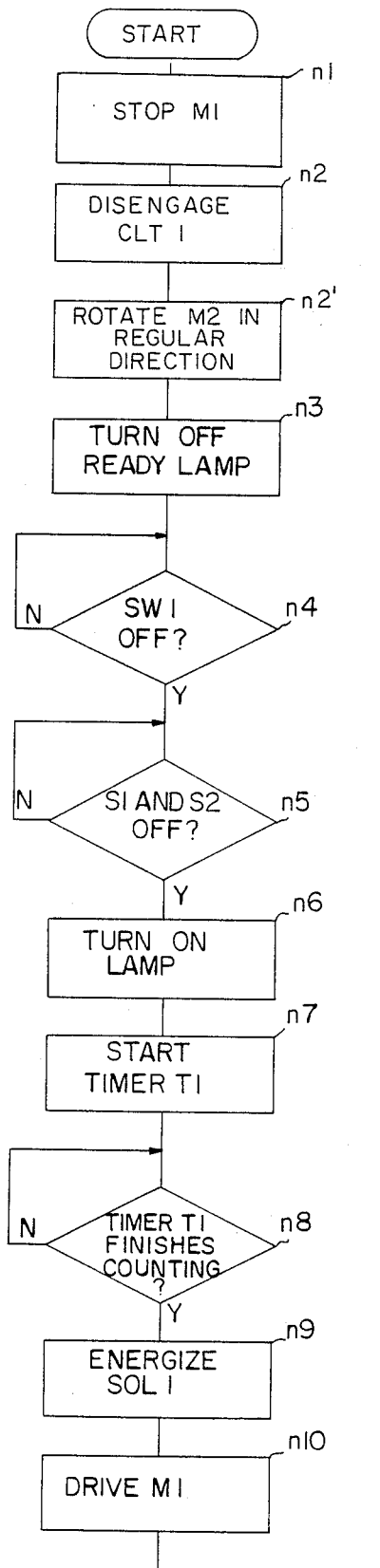
FIG. 7 is a flow-chart showing the operation of the control system of the apparatus of the invention that comprises the pressure-release system of FIG. 5.
Figure 7:
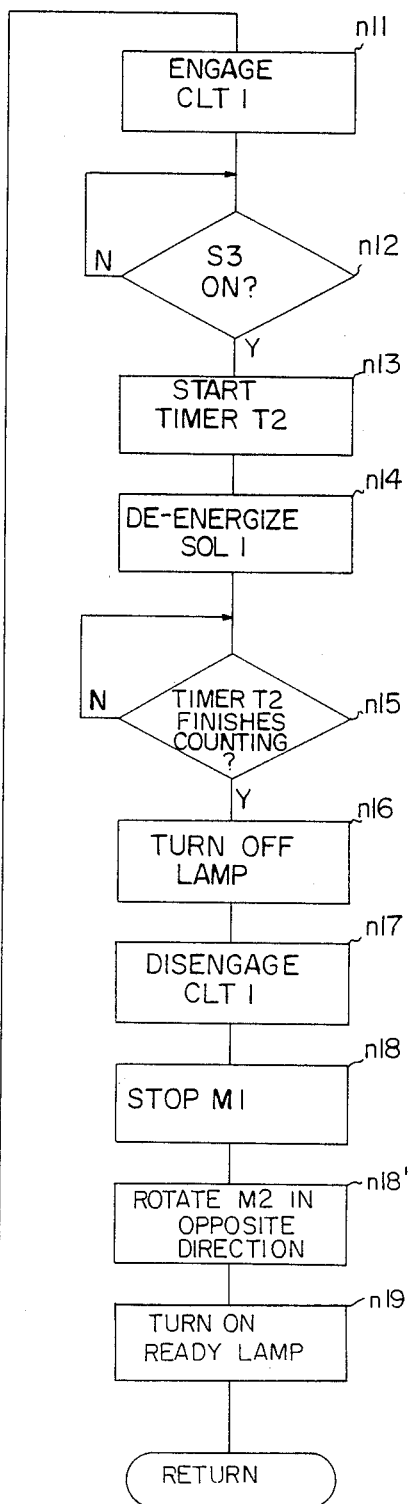

FIG. 7 is a flow-chart showing the procedure of the above-mentioned operation. The procedure of this operation is the same as that of Example 1, except that the pressure-release motor M2 rotates in its regular direction in step n2' and it is rotated in the opposite direction in step n18'. When the pressure-release motor M2 is rotated in the regular direction in the step n2', the pressure rollers 2 and 3 are moved away from each other, so that the photosensitive sheet 34 can be transported therebetween without being pressurized. Thus, the unhardened pressure-rupturable capsules thereon, if any, will not rupture, preventing the chromogenic materials therein from flowing out. In this example also, after the portion of the photosensitive sheet 34 that has remained in the buffer section 10 is transported into the pressure-transfer section 6 (steps n10 and n11), the photosensitive sheet 34 is further drawn out by the same length as that of the light-exposure section 30 (steps n13–n18). This ensures that the new portion of the photosensitive sheet 34 becomes the next image-forming area, the front end of which is at the exposure-starting position, thereby being ready for the next light-exposure step for the proper formation of the next latent image. When the pressure-release motor M2 rotates in the opposite direction in the step n18', the pressure-rollers 2 and 3 come back to their original positions to be pressed against each other, thereby being ready for the next pressure-transfer step.

Thus, in the apparatus of this example, the latent image that has been formed in the light-exposure step and remained in the buffer section 10 is exposed to the light from the lamp 7 so that the unhardened pressure-rupturable capsules thereon become hardened from the step n6 through the step n16 and, moreover, the photosensitive sheet 34 is transported through the pressure-transfer section 6 without being pressurized. This surely prevents the pressure-rupturable capsules from rupturing at the pressure-transfer section 6. Accordingly, the pressure rollers 2 and 3 and/or the inside of the body will not be stained with the chromogenic materials. Furthermore, when another image-receiving sheet is transported into the pressure-transfer section 6 in the next image-forming process, the back of the image-receiving sheet will not be stained with the chromogenic materials.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for the formation of images, in which a photosensitive sheet coated with pressure-rupturable capsules that are hardened by light is first transported through a light-exposure section to be illuminated by an illuminating means to obtain a latent image, and then temporarily stored in a buffer section, and transported through a pressure-transfer section consisting of a pair of pressure rollers to be pressed against an image-receiving sheet to obtain a colored image on said image-receiving sheet, and is finally wound around a take up rod, said illuminating means selectively illuminating said photosensitive sheet so as to harden some of the pressure-rupturable capsules thereon to form said latent image, and said apparatus comprising:

a secondary illuminating means for entirely illuminating a predetermined portion of said photosensitive sheet so as to harden all the pressure-rupturable capsules thereon when said portion of said photosensitive sheet is being transported alone through said pressure-transfer section without said image-receiving sheet after the jamming by said image-receiving sheet occurs and the jammed sheet is removed from the body of the apparatus.

2. An apparatus according to claim 1, which further comprises a pressure-release means that moves said pressure rollers of said pressure-transfer section away from each other so as to allow said predetermined portion of said photosensitive sheet to be transported therebetween without being pressurized.

3. An apparatus according to claim 1, wherein said predetermined portion of said photosensitive sheet illuminated by said secondary illuminating means includes at least the portion of said photosensitive sheet corresponding to said latent image that has been formed thereon before said jamming occurs.

* * * * *